United States Patent [19]
Vavrek et al.

[11] Patent Number: 5,311,135
[45] Date of Patent: May 10, 1994

[54] MULTIPLE TAP GRADIENT FIELD COIL FOR MAGNETIC RESONANCE IMAGING

[75] Inventors: Robert M. Vavrek, Waukesha; Christopher C. Myers, Milwaukee, both of Wis.

[73] Assignee: General Electric Company, Milwaukee, Wis.

[21] Appl. No.: 988,986

[22] Filed: Dec. 11, 1992

[51] Int. Cl.5 .............................................. G01V 3/00
[52] U.S. Cl. ................................... 324/318; 324/322
[58] Field of Search ............... 324/318, 322, 307, 309, 324/300; 128/653.5; 335/299, 296; 336/137, 150

[56] References Cited

U.S. PATENT DOCUMENTS

| 4,636,728 | 1/1987 | Compton et al. | 324/318 |
| 4,646,024 | 2/1987 | Schenck et al. | 324/318 |
| 4,656,447 | 4/1987 | Keim et al. | 335/216 |
| 4,737,716 | 4/1988 | Roemer et al. | 324/319 |
| 4,794,338 | 12/1988 | Roemer et al. | 324/39 |
| 4,840,700 | 6/1989 | Edelstein et al. | 156/634 |
| 5,130,656 | 7/1992 | Requardt et al. | 324/318 |
| 5,227,728 | 7/1993 | Kaufman et al. | 324/318 |
| 5,235,279 | 10/1993 | Kaufman et al. | 324/318 |

Primary Examiner—Louis Arana
Attorney, Agent, or Firm—Quarles & Brady

[57] ABSTRACT

An NMR imaging system includes an apparatus for producing a magnetic field gradient within an imaging volume into which the object being imaged is placed. The relatively linear region of the magnetic field gradient is adjusted depending upon the size of the object. The apparatus comprises a source of a gradient signal and four saddle coils positioned in quadrant of a sheet that is wrapped around a cylindrical form. Each saddle coil has a spiral shaped conductive pattern on which are located a primary termination point and a pair of secondary termination points. A switch mechanism connects the four saddle coils in series with the source of a gradient signal, so that voltage from the gradient signal is applied between the primary termination point and a selected secondary termination point of each saddle coil. A control signal applied to the switch mechanism indicates selected secondary termination point and the signal varies according to the size of the object.

11 Claims, 5 Drawing Sheets

MULTIPLE TAP GRADIENT FIELD COIL FOR MAGNETIC RESONANCE IMAGING

BACKGROUND OF THE INVENTION

The field of the invention is magnetic resonance imaging systems, such as those used for medical diagnosis; and more particularly, to coils employed in such systems to establish magnetic field gradients within a region of interest.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but randomly oriented magnetic components in the perpendicular, or transverse, plane (X-Y plane) cancel one another. If the substance or tissue is subjected to a magnetic field (excitation field $B_1$) which is in the X-Y plane and which is near the Larmor frequency, the net aligned moment ($M_z$) may be rotated, or "tipped", into the X-Y plane to produce a net transverse magnetic moment $M_t$, which is rotating, or spinning, in the X-Y plane at the Larmor frequency. The practical value of this phenomenon resides in the electrical signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The region of interest may be a small portion of a patient's anatomy, such as the head or heart, or a much larger portion, such as the entire thorax. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields (Gx, Gy, and Gz) which have the same direction as the polarizing field $B_0$, but which have a gradient along the respective X, Y and Z axes. The magnetic field gradients are produced by a trio of coil assemblies placed around the object being imaged. By controlling the strength of these gradients during each NMR cycle, the spatial distribution of spin excitation can be controlled and the location of the resulting NMR signals can be identified.

In order to accommodate the imaging of large portions of a patient, each gradient field coil assembly must produce a magnet field that varies linearly along one axis of a very large volume. This requirement necessitates a substantial amount of power to drive the coils and the ability to vary the field at relatively high speed. Even when the region of interest is relatively small, the power consumption of the conventional gradient coils remains the same as for larger regions.

Patients being imaged can experience peripheral nerve stimulation, if the amplitude and temporal rate of change of the gradient fields are great enough. For example, during imaging of the thorax, the head of the patient is positioned in the fringe region of the gradient field where it is exposed to a cross-term of the field. This exposure can produce small electric currents in the patient's head which stimulate the nerves, in the nose for example, and producing an annoying sensation. Although not life threatening, this phenomenon can be considered invasive and desirable to avoid.

SUMMARY OF THE INVENTION

An NMR imaging system has a magnet assembly which creates strong magnetic fields within an imaging volume into which a body being imaged is placed. That assembly includes a main magnet for producing a polarizing magnetic field $B_0$ and a radio frequency coil to excite nuclei located within the body and receiving NMR signals emitted by excited nuclei.

Two transverse coil sub-assemblies also are provided to establish magnetic field gradients along two orthogonal axes within an imaging volume. In the preferred embodiment, the coil sub-assembly is formed by four saddle shaped coils positioned on a cylindrical form. Each saddle coil has a spiral shaped conductive pattern on which are located a primary termination point and a pair of secondary termination points to which a gradient signal can be applied to create a magnetic field gradient. The gradient signal is produced by a generator within the NMR imaging system. A mechanism allows the selection of one of the secondary terminations for each coil depending upon the size of a region of interest that contains features of the body that are to be imaged. A switch responds to the mechanism by applying voltage from the gradient signal between the primary termination and a selected secondary termination of each saddle coil.

A third coil sub-assembly preferably is provided to establish a gradient field along the third orthogonal axis within the imaging volume. Taps can be employed to excite different segments of the third coil sub-assembly.

In applications where an outer coil is used as a shield to prevent other fields within the system from effecting the gradient coils, the outer coil can be excited at different points depending upon the excitation points of the gradient coils.

An object of the present invention is to provide an apparatus that enables a relatively linear region of the magnetic field gradient to be reduced or enlarged to conform to the size of the region of interest. Such alteration of the magnetic field gradient enables the amount of power used to create the magnetic field gradient to be reduced when the region of interest is small. Alternatively, this apparatus enables the full power output of the gradient signal generator to be used in the creation of a faster magnetic field gradient within the smaller region of interest.

DETAILED DESCRIPTION OF THE INVENTION

Figure 1:
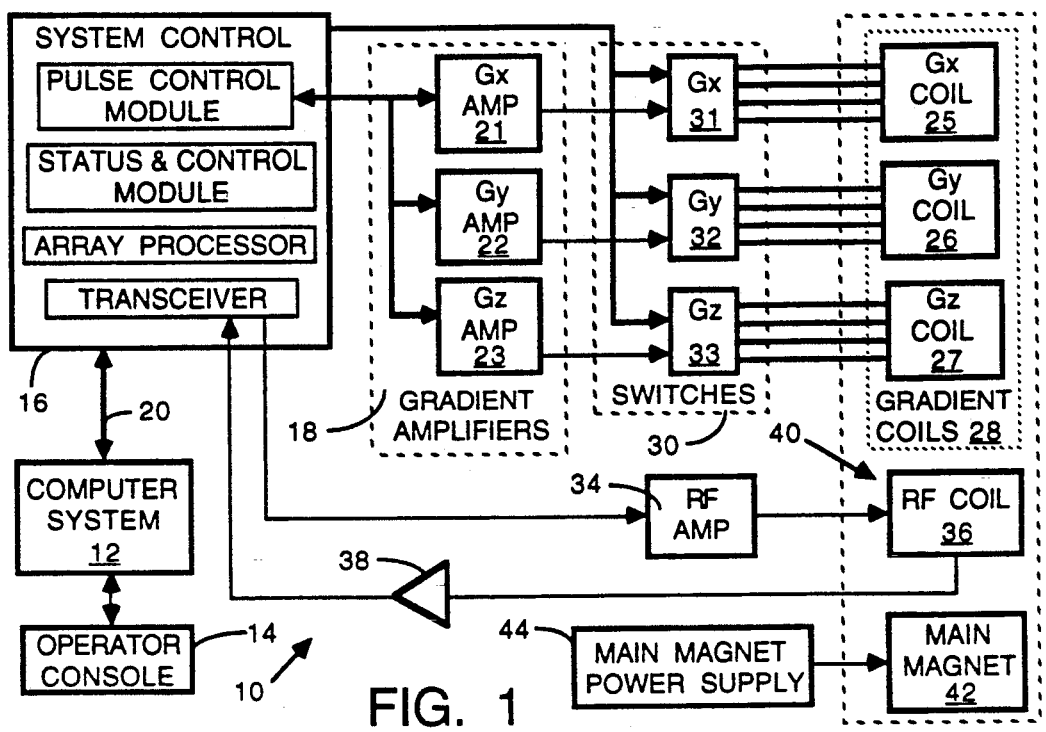
FIG. 1 is a block diagram of an NMR system which employs the present invention.

Referring initially to FIG. 1, there is shown in block diagram form the major components of an NMR system 10 in which the present invention can be used. The overall operation of the system is under the control of a host computer system 12 which includes an interface through which other NMR system components are coupled. Also included in the computer system 12 is an image processor which provides interactive image display manipulation such as magnification, image comparison, gray-scale adjustment and real-time data display. An operator console 14 is coupled to the computer system 12 and provides the operator with the means to input data pertinent to a patient study as well as additional data necessary for proper NMR system operation, such as calibrating, initiating and terminating scans. The operator console 12 also is used to display images stored on disks or magnetic tape.

The computer system 12 exercises control over the NMR system by means of system control 16 and gradient amplifier system 18. The computer system 12 communicates with system control 16 by means of a link 20 in a manner well known to those skilled in the art. The system control 16 includes several conventional subsystems such as a pulse control module, an array processor, a radio frequency transceiver, and a status and control module. For a detailed description of the system control 16, reference is made to U.S. Pat. Nos. 4,952,877 and 4,992,736 which are incorporated herein by reference.

With respect to the present invention, waveforms for the field gradients are applied by the pulse control module in the system control 16 to the gradient amplifier unit 18 generally comprised of Gx, Gy and Gz amplifiers 21, 22 and 23, respectively. Each amplifier 21, 22 and 23 excites a corresponding Gx, Gy and Gz gradient coil 25, 26 and 27, respectively, in a set generally designated 28. Specifically the output of each gradient amplifier 21, 22 or 23 is coupled via a Gx, Gy and Gz gradient switch 31, 32 or 33 in switch unit 30 to the associated gradient coil 25, 26 and 27. As will be described the switches 31, 32 and 33 respond to control signals from the system control 16 by coupling the gradient waveform to appropriate taps of the coils 25, 26 and 27. When energized, these coils generate gradients Gx, Gy and Gz of the magnetic field in the same direction as the main polarizing magnetic field, wherein the gradients are directed in mutually orthogonal X, Y and Z axis directions of a Cartesian coordinate system.

The magnetic field gradients are utilized in combination with radio frequency pulses generated by a transceiver in the system control 16, RF power amplifier 34 and transmit/receive RF coil 36 to encode spatial information into the NMR signals emanating from the region of the patient being studied. Waveforms and control signals provided by the pulse control module in the system control 16 are utilized by the transceiver for RF carrier modulation and mode control. In the transmit mode, a radio frequency waveform is modulated in accordance with the control signals to an RF power amplifier 34 which then energizes RF coil 36 situated within the magnet assembly 40 to produce the excitation field $B_1$. The NMR signals radiated by the excited nuclei in the patient are sensed by the RF coil 36 and amplified by a preamplifier 38. The NMR signals are demodulated, filtered, and digitized in the transceiver in the system control 16. The processed NMR signals are used to construct a image for display on the operator console 14 using conventional techniques.

The gradient coil set 28 and the RF coil 36 are mounted within the bore of the main magnet 42 utilized to produce the polarizing magnetic field. In the case of a superconductive magnet, the main power supply 44 is employed to bring the polarizing field produced by the magnet 42 to the proper operating strength and then is disconnected. The main magnet 42, the gradient coil set 28 and RF coil 36 are part of the magnet assembly 40.

Figure 2:
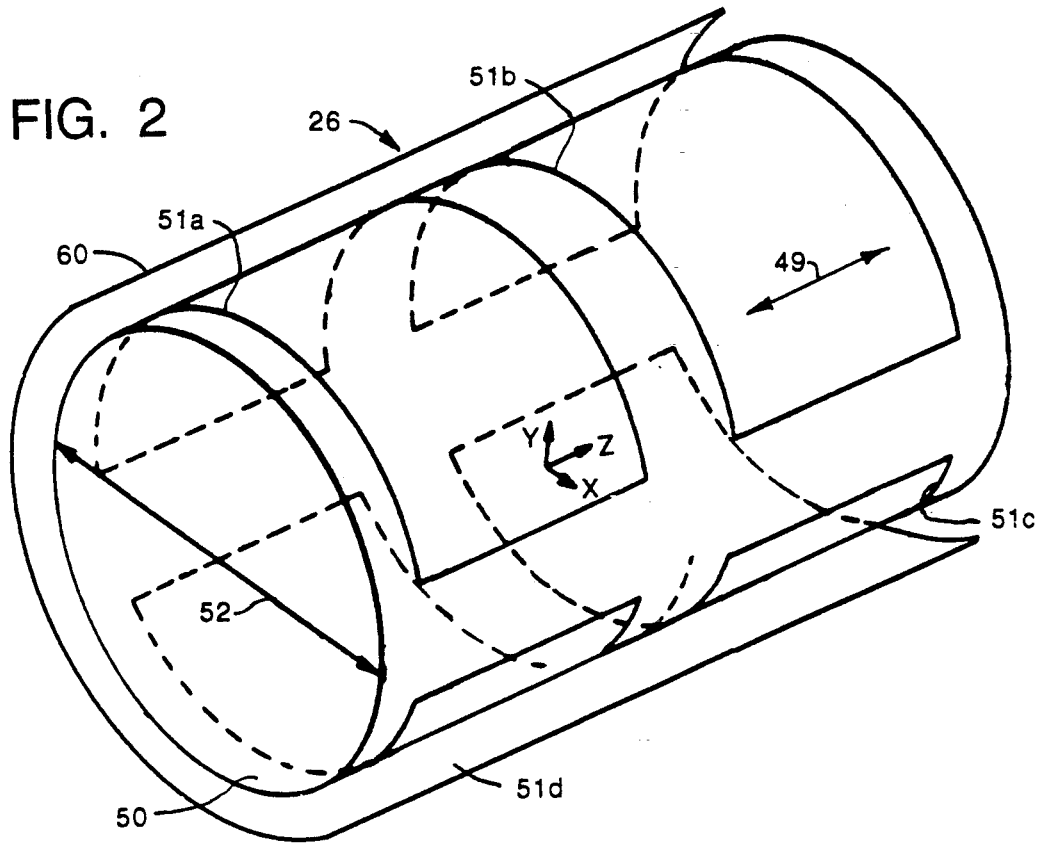
FIG. 2 is an isometric illustration of a transverse gradient coil assembly mounted on a cylindrical coil form.

FIG. 2 illustrates in a general fashion the configuration conventionally employed in the construction of transverse gradient coils 25 and 26. Specifically, the illustrated coil winding pattern is configured to produce a magnetic field having a component along the axial direction of the cylindrical form 50 which component exhibits a uniformly linear variation in a direction perpendicular to the longitudinal axis 49. In the illustrated coil orientation, the gradient coil 26 produces a magnetic field gradient Gy which varies linearly in a direction Y substantially perpendicular to the diameter line 52.

It is seen that the Gy transverse gradient coil 26 comprises four saddle shaped coils 51a, 51b, 51c and 51d connected in series and wrapped partially around the coil form 50 to exhibit symmetry in the three axes. First, the saddle coils are disposed symmetrically with respect to the longitudinal (or Z) axis 49, and second, the saddle coils exhibit mirror image symmetry with respect to a plane perpendicular to the X axis. Third, because the saddle coils 51a–51d illustrate the configuration provided to generate a field gradient in the Y direction, there also is a mirror image symmetry with respect to the plane perpendicular to the Y axis, namely the X-Z plane. A transverse gradient coil of this general design is described in detail in U.S. Pat. No. 4,840,700.

The X-axis transverse gradient coil 25 has the same structure as the Y-axis transverse gradient coil 26, shown in FIG. 2, except that saddle coils for the X-axis are oriented ninety degrees around the longitudinal axis 49 from the position of the Y-axis saddle coils 51a–51d. Although the present invention is being described in the context of the Y-axis transverse gradient coil 26, the X-axis transverse gradient coil 26 is constructed and operated in a similar manner. In addition, the general concepts of the present invention can be applied to the Z-axis gradient coil 27, although that coil has a different construction.

Figure 3:
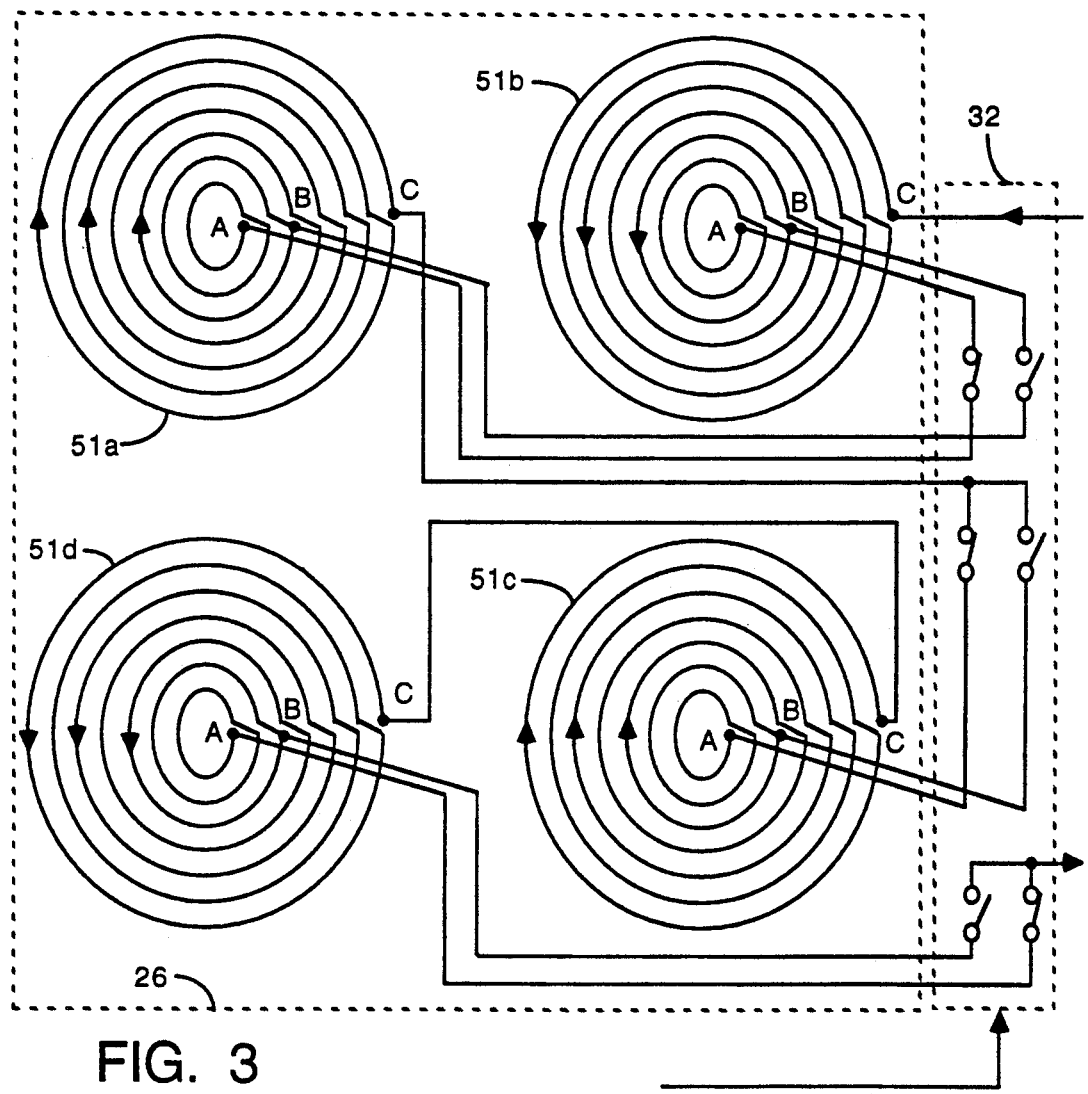
FIG. 3 is a planar representation of the transverse gradient coil assembly shown in FIG. 2.

Because the surface of the cylindrical form 50 is isometric to the plane and since it is generally more convenient to depict planar images, the construction of saddle coils 51a–51d is described herein in accordance with patterns exhibited by specially designed coils that are disposed in a planar configuration prior to wrapping them around the form 50 or a mandrel. With this in mind, attention is directed to FIG. 3 in which the four saddle coils 51a–51d of the Gy gradient coil assembly 26 in FIG. 2 are shown in an unrolled, planar pattern. Each saddle coil 51a–51d has three termination points with a primary termination point C always being used to connect one coil to another, or in the case of coil 51b to the Gy gradient amplifier 22. The Gy gradient switch connects one of a pair of secondary termination points A or B to another coil or in the case of coil 51d to the Gy gradient amplifier 22. Gy switch 32 responds to a control signal 16 from the system control by connecting the four saddle coils 51a–51d in series to the output of the Gy gradient amplifier 22. Arrow heads in FIG. 3 indicate the desired direction of current flow within the four saddle coils 51a–51d. Of course the current direction in all of the saddle coils can be reversed without deleteriously affecting the operation of the imaging system. It is generally understood that the number of turns in each saddle coil and the magnitude of the current applied are selected to provide the desired gradient field strength.

Figure 5:
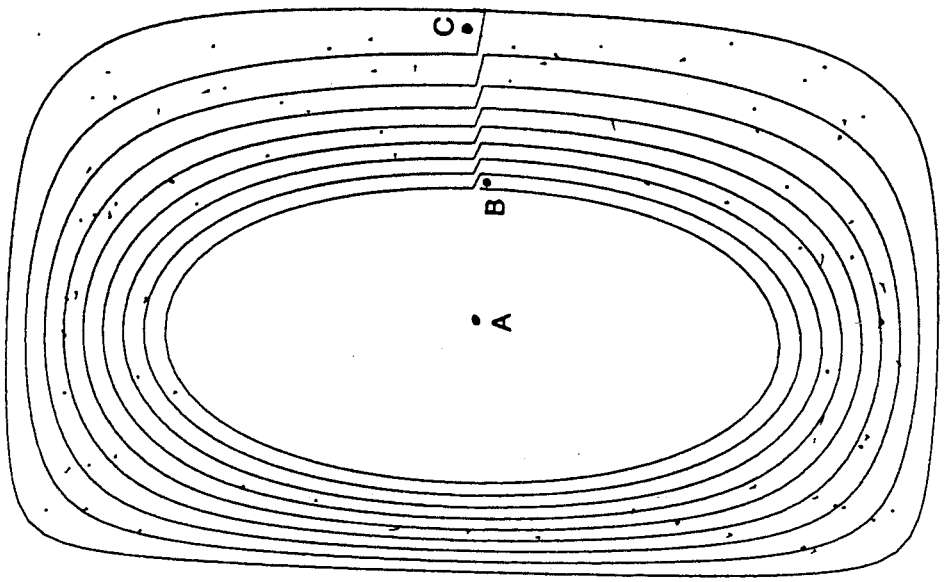
FIG. 5 is a planar representation of effective electrical sections of the saddle coil in FIG. 4 during one mode of operation.
Figure 4:
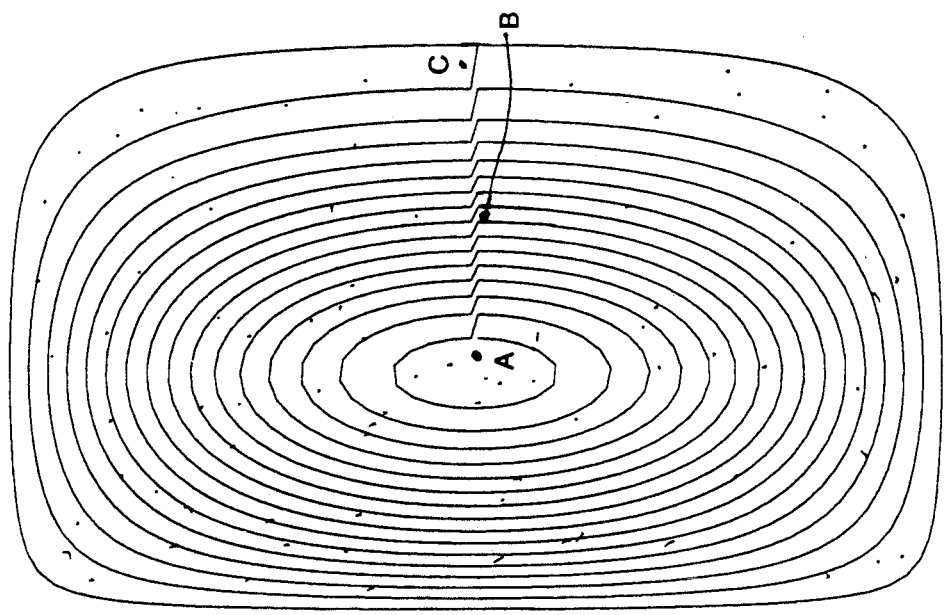
FIG. 4 is a planar representation of a saddle coil which forms part of the transverse gradient coil assembly.

FIG. 4 shows the details of a typical saddle coil 51b for the Gy gradient coil 26 with the other three saddle coils having similar construction. The saddle coil 51 comprises a spiral of a relatively wide copper conductor with each convolution of the spiral separated by a narrow gap. This pattern may be formed by applying a layer of copper to a flexible, non-magnetic substrate and etching or machining the copper to form the spiral gap. Alternatively, discrete wires can be applied to the substrate in place of the copper layer. Although a typical saddle coil may have thirty-two turns, a sixteen turn coil is shown for ease of illustration. Cables from the Gy switch 32 are connected to saddle coil 51b at termination points A, B and C. In the case of illustrated saddle coil 51b, the Gy gradient amplifier output is applied to a primary termination point C. The Gy switch 32 selectively couples either termination point A of saddle coil 51b to termination point A of saddle coil 51a, or termination point B of saddle coil 51b to termination point B of saddle coil 51a, depending upon the imaging protocol selected by the system operator. For example, electric current is applied through all sixteen coil turns between termination points A and C of each saddle coil 51a–51d, when large anatomical feature is being imaged. In this mode the gradient coil assembly 28 functions in much the same manner as previous gradient coils. When a smaller anatomical feature, such as a head or heart, is being imaged the Gy switch 32 sends the current through the portions of the saddle coils between terminations B and C, with the coil portions between termination points A and B floating electrically. In this latter mode of operation, each saddle coil 51a–51d functions electrically as though it had only eight turns (those between points B and C) instead of sixteen turns as illustrated in FIG. 5.

When the segments of each saddle coil 51a–51d between terminations B and C is excited, the switch connected to termination A is opened to prevent a electrical path which would allow eddy currents to flow within the segments of the saddle coils between terminations A and B.

Since the inductance of the Gy gradient coil 26 is less when fewer turns of each saddle coil are used, less voltage is required to produce the transverse magnetic field gradient within the smaller region of interest. Thus, if the region of interest is relatively small, such as for imaging the heart or the head of the patient, voltage can be conserved by exciting only the outer turns of each saddle coil as illustrated in FIG. 5. Alternately, a faster magnetic field may be established within this smaller region by applying the full output voltage of the gradient amplifiers 21–23 between termination points B and C of the saddle coils 51a–51d.

Figure 6:
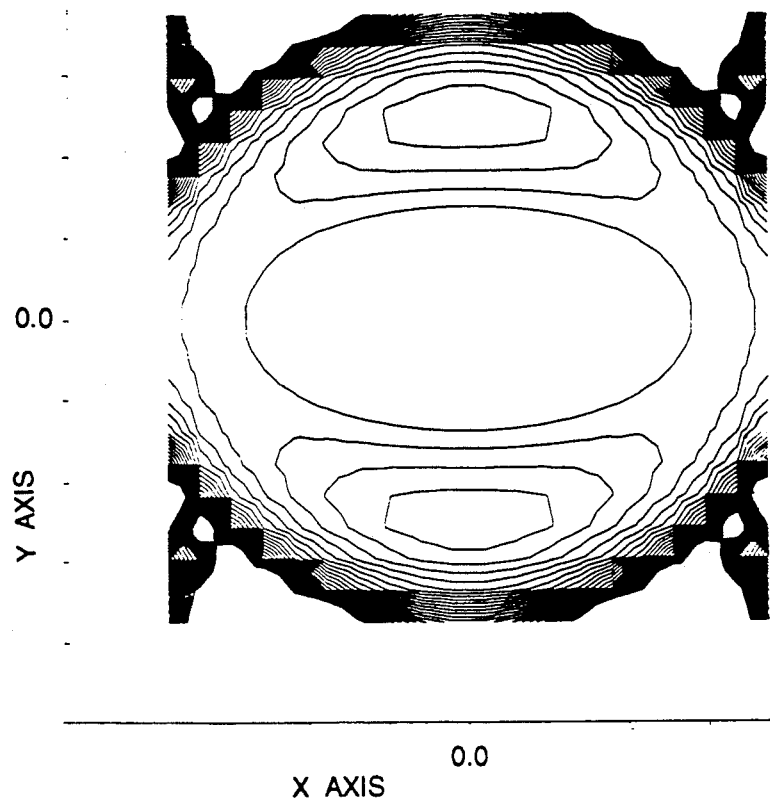
FIG. 6 is an plot of a gradient magnetic field indicating contours of equal error when the entire length of each saddle coil is excited.
Figure 7:
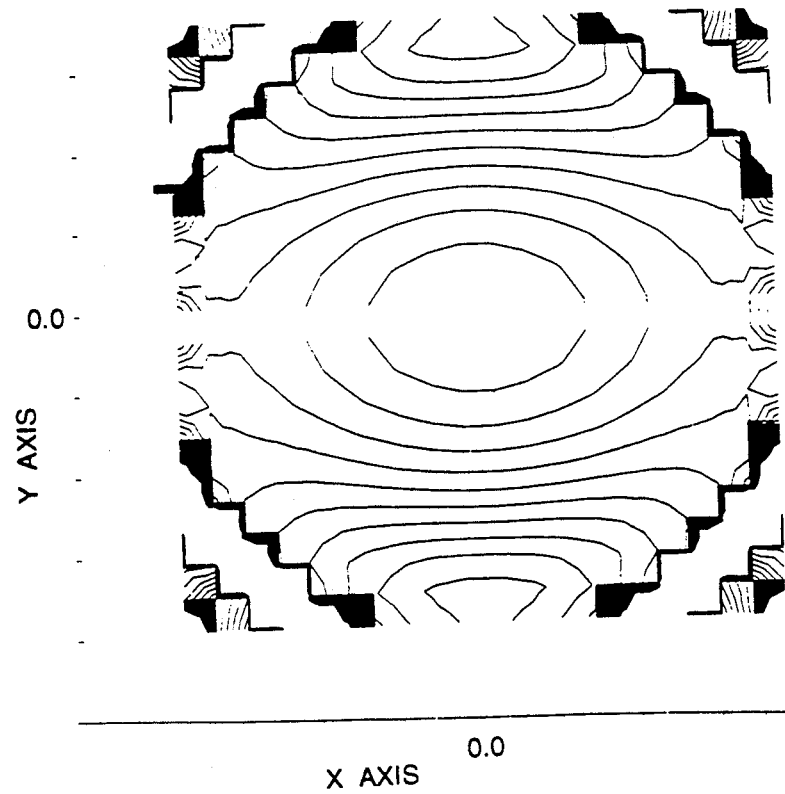
FIG. 7 is an error plot similar to FIG. 6 when only a portion of each saddle coil is excited.

However, exciting only a portion of the transverse gradient coils 25 and 26 adversely affects the linearity of their magnetic fields. Because of the imperfect field contours provided by the saddle coils in FIG. 2, there exists differences between the actual field produced and the ideal field that is desired. FIGS. 6 and 7 illustrate error plots showing deviation of the actual gradient magnetic field produced from the ideal field when the saddle coils are excited as shown in FIGS. 4 and 5, respectively. The central elliptical contour line in each figure corresponds to approximately the same amount of deviation from the ideal. It is immediately apparent from a comparison of the contour plots in FIGS. 6 and 7 that a larger near-ideal area exists when the whole saddle coils 51a–51d are excited as compared to when a small section of the saddle coils are excited.

Although exciting only part of the gradient coils 25–27 reduces the area of uniform linearity within the magnet assembly 40, that area is sufficiently large to incorporate the smaller region of interest for imaging a heart or head of the patient.

Figure 8:
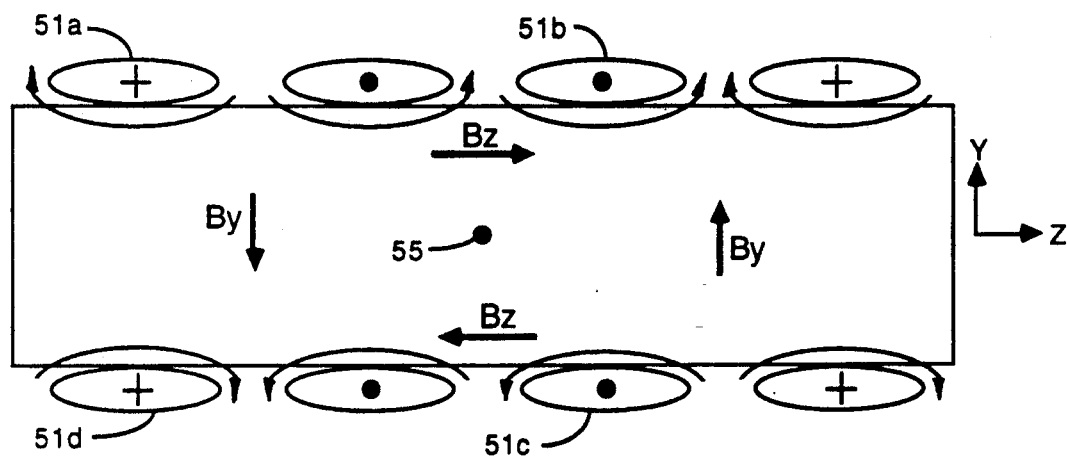
FIG. 8 is a schematic representation of longitudinal cross-section through one transverse gradient coil depicting directions of the magnetic flux.

Referring to FIG. 8, a gradient field coil having saddle coils 51a–51d produces a magnetic flux density along the Z axis as represented by vectors Bz on either side of the magnetic field isocenter 55. In addition, the coils produce a concomitant field in the orthogonal direction as indicated by vectors By. When magnetic resonance imaging is used to view a patient's heart, the patient is placed within the magnet assembly so that the heart is located at the isocenter 55. In some conventional systems, this places the head of the patient in a region where the magnetic flux density By of the concomitant field is relatively high. Nerve stimulation in the nose of patients may occur due to the high magnetic flux density By. Similar peripheral stimulation is caused by the Bx field in the Gx gradient coil. In general, all coins including the Gz gradient coil have concomitant fields.

When viewing the heart using the present system, the uniform portion of the magnetic field gradients can be reduced in size so as to produce a uniform field volume which is slightly bigger than the patient's heart. The field need not be highly uniform in the region of the patient's head in this situation. Therefore, by using a smaller section of one or more of the gradient field coils 25–27, for example the section between terminations B and C, the magnitude of the concomitant magnetic flux By in FIG. 8 can be reduced. As can be seen by a comparison of FIGS. 4 and 5, exciting only the outer section of a gradient field coil increases the cross sectional area of the non-excited section near the center of the coil. This in effect spreads out the magnetic flux density of the concomitant field over a wider cross sectional area decreasing the severity of that flux density. With a reduction in the magnitude of the concomitant magnetic flux density, the nerves in the periphery of the patient are not stimulated as severely as when the entire gradient field coil is utilized. Thus, the patient does not perceive peripheral nerve stimulation.

As shown in FIG. 2, it is quite common to place a cylindrical secondary or shield coil 60 around a gradient field coil 50 to prevent eddy currents from occurring in the magnetic structure. A longitudinal cross sectioned shield coil 60 is illustrated in order to show the gradient field coil 50 in the drawing. Such shield coils are described in U.S. Pat. No. 4,737,716 which description is incorporated herein by reference.

Figure 9:
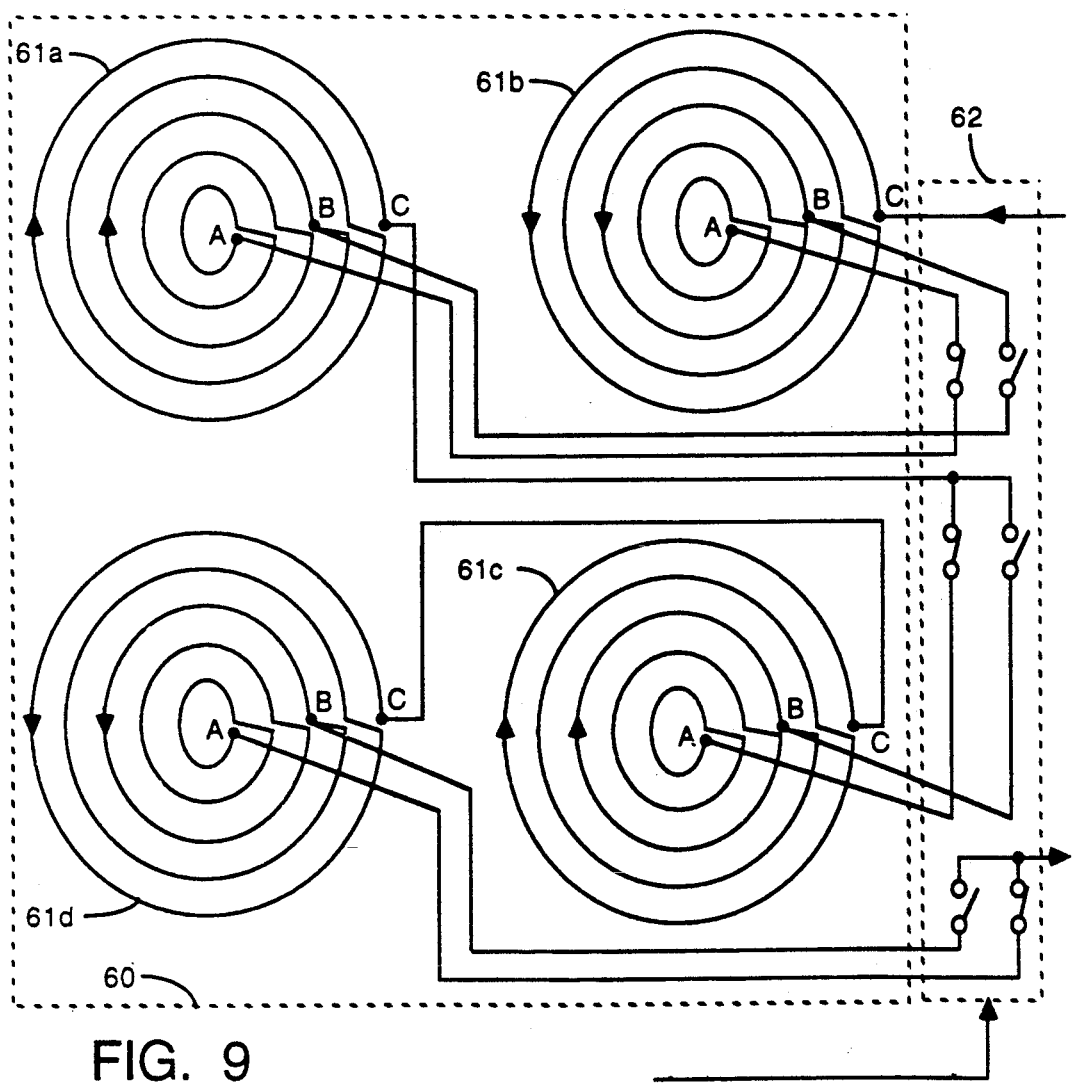
FIG. 9 is a planar representation of a shield coil having multiple terminations.

FIG. 9 is a planar depiction of a shield coil 60 that is formed by four saddle coils 61a, 61b, 61c and 61d each of which typically has a fraction the number of turns as the corresponding gradient saddle coils 51a, 51b, 51c and 51d. It is also desirable to provide multiple taps on the shield coil 60 and excite only certain segments that are associated with the similar sized segments of the gradient saddle coils. The intermediate termination B on each shield saddle coil 61a-61d is at a point along the spiral conductive pattern that is proportionally the same as the location of the intermediate termination on the associated magnetic gradient saddle coil 51a-51d. For example, if the intermediate terminations B on the magnetic gradient saddle coils are at the coil mid points, the intermediate terminations on the shield saddle coils also will be near their midpoints. The precise location of the intermediate terminations can be determined by MRI experiments. A switch mechanism 62 applies an excitation current to the different terminations on the shield saddle coils.

One skilled in the art will immediately appreciate that the resistance and inductance of each transverse coil 25-27 changes as different termination points are selected. Since the changing of these electrical parameters alters the load which is placed on the gradient field amplifiers 21-23, any load compensation provided in those amplifiers must also be changed. This can be accomplished easily by switching in different load compensation circuits depending upon the segments of the gradient field coils which have been selected for excitation. Similarly, any eddy current compensation values or calibration values which have been stored within the system control 16 may also have to be changed as different sections of the gradient field coils are excited.

The basic use of the present invention is to size the are of high linearity in the magnetic field gradient to correspond the region of interest of the object being imaged and once so configured, the magnetic field linearity remains static during a NMR scan. Alternatively the present gradient coil assembly enables the area of high linearity in the magnetic field gradient to be moved within the object during the NMR scan. This is accomplished by switching the application of the gradient signal from the gradient amplifiers 18 to different termination points on the saddle coils as the NMR scan is occurring. Although the present invention has been described in terms of saddle coils with three terminations, more terminations can be provided and the inventive concept may be used with other coil designs.

The invention being claimed is:

1. In an NMR imaging system, an apparatus for producing a magnetic field gradient comprising:
a source of a gradient signal;
a coil located to establish a magnetic field gradient within an imaging volume, said coil having three termination points; and
a switch mechanism for connecting said coil to the source of a gradient signal, so that voltage from the gradient signal can be applied between different pair combinations of the three termination points.

2. The apparatus for producing a magnetic field gradient as recited in claim 1 further comprising means for operating said switch mechanism to select a pair combination of the three termination points of said coil in response to a size of a region of interest within the body.

3. In an NMR imaging system, an apparatus for producing a magnetic field gradient comprising:
a source of a gradient signal;
a plurality of saddle coils positioned on a cylindrical form, wherein each saddle coil has a spiral shaped conductive pattern, a primary termination point on the conductive pattern, and a pair of secondary termination points on the conductive pattern; and
a switch mechanism for connecting the plurality of saddle coils in series with the source of a gradient signal, so that voltage from the gradient signal is applied between the primary termination point and a selected secondary termination point of each saddle coil, with the selected secondary termination point being determined by a control signal applied to the switch mechanism.

4. The apparatus for producing a magnetic field gradient as recited in claim 3 further comprising means for producing the control signal to select one of the secondary termination points of each saddle coil in response to a size of a region of interest within the body.

5. The apparatus for producing a magnetic field gradient as recited in claim 4 further comprising an input device through which a user specifies the region of interest within the body to be imaged.

6. The apparatus for producing a magnetic field gradient as recited in claim 3 further comprising means for producing the control signal to select one of the secondary termination points of each saddle coil so as to reduce magnetic flux density of a concomitant field produced by the plurality of saddle coils.

7. The NMR imaging system as recited in claim 3 further comprising:
a plurality of shield saddle coils, with each one being adjacent to one of said plurality of saddle coils and having a primary shield termination and two secondary shield terminations; and
a switch mechanism that responds to said means for selecting by applying electric current between the primary shield termination and one of the secondary shield terminations of each shield saddle coil.

8. In an NMR system for imaging a body, a magnet field generation assembly comprising:
a main magnet which produces a polarizing magnetic field $B_0$ within an imaging volume;
two coils for creating magnetic field gradients along two orthogonal axes within the imaging volume, each of said coils having a primary termination and a pair of secondary terminations;
means for selecting one of the pair of secondary terminations for each coil in response to a size of a region of interest within the body;
a switch responds to said means for selecting by applying electric current between the primary termination and the selected secondary termination of each gradient coil; and a radio frequency coil for exciting nuclei of the body and for receiving NMR signals emitted by excited nuclei.

9. The NMR imaging system as recited in claim 8 wherein each gradient coil comprises a spiral-shaped conductive element having the primary termination near one end of the conductive element, one secondary termination near another end of the conductive element, and another secondary termination between the two ends.

10. The NMR imaging system as recited in claim 8 wherein at least one of the gradient coils comprises four saddle coils positioned on a cylindrical form, in which each saddle coils has a spiral shaped conductive element with the primary termination near one end of the conductive element, one secondary termination near another end of the conductive element, and another secondary termination between the two ends.

11. The NMR imaging system as recited in claim 8 further comprising:
- a shield coil assembly located to shield said two coils from magnetic fields, and having a primary shield termination and two secondary shield terminations; and
- a switch mechanism that responds to said means for selecting by applying electric current between the primary shield termination and the selected secondary shield termination of said shield coil assembly.

* * * * *